United States Patent [19]

Parks et al.

[11] Patent Number: 4,646,424
[45] Date of Patent: Mar. 3, 1987

[54] DEPOSITION AND HARDENING OF TITANIUM GATE ELECTRODE MATERIAL FOR USE IN INVERTED THIN FILM FIELD EFFECT TRANSISTORS

[75] Inventors: Harold G. Parks, Scotia; George E. Possin, Schenectady, both of N.Y.

[73] Assignee: General Electric Company, Schenectady, N.Y.

[21] Appl. No.: 761,937

[22] Filed: Aug. 2, 1985

[51] Int. Cl.$^4$ .............................................. H01L 29/78
[52] U.S. Cl. ........................................ 29/571; 29/591; 148/DIG. 131; 357/23.7; 156/643
[58] Field of Search ................................. 29/571, 591; 148/DIG. 131; 357/23.7; 156/643

[56] References Cited

U.S. PATENT DOCUMENTS

| | | | |
|---|---|---|---|
| Re. 30,505 | 2/1981 | Jacob | 156/643 |
| 3,514,676 | 5/1970 | Fa | 357/23.7 |
| 3,806,365 | 4/1974 | Jacob | 204/164 |
| 4,333,965 | 6/1982 | Chow et al. | 156/643 |
| 4,558,340 | 12/1985 | Schohter et al. | 357/2 |

OTHER PUBLICATIONS

Colclaser, Microelectronics Processing and Device Design, John Wiley and Sons, New York, 1980, pp. 44–45, 79–83 and 108–109.
"Silicon TFTs for Flat Panel Displays", by F. Morin and M. LeContellec, Hewlett Packard Journal, (date unknown).
"Amorphous-Silicon Thin-Film Metal-Oxide-Semiconductor Transistors", by Hiroshi Hayama and Masakiyo Matsumura, Applied Physics Letters, vol. 36, No. 9 (May 1980).
"Amorphous Silicon-Silicon Nitride Thin-Film Transistors", by M. J. Powel et al., Applied Physics Letters, vol. 38, No. 10 (May 1981).
"Application of Amorphous Silicon Field Effect Transistors in Addressable Liquid Crystal Display Panels", by A. J. Snell et al., Applied Physics, vol. 24, pp. 357–362 (1981).
"A TFT-Addressed Liquid Crystal Color Display", by M. Sugata et al. (Oct. 1983), Proceedings of the Third International Display Research Conference, Paper No. 53.
"Amorphous-Silicon TFT Array for LCD Addressing", by M. V. C. Stroomer, Electronic Letters, vol. 18, No. 20 (1982).
"High Resolution Transparent-Type a-Si TFT LDCs", by K. Suzuki et al., SID Digest, (1983).
"Promise and Challenge of Thin-Film Silicon Approaches to Active Matrices", by A. I. Lakatos, 1982 International Display Research Conference, IEEE, pp. 146–151.
"Application of Amorphous Silicon Field Effect Transistors in Integrated Circuits", by A. J. Snell et al., Applied Physics, vol. A26, pp. 83–86.
Rand, M., "Plasma-Promoted Deposition of Thin Inorganic Films", J. Vac. Sci. Technol., vol. 16(2), pp. 420–427.

Primary Examiner—Brian E. Hearn
Assistant Examiner—John T. Callahan
Attorney, Agent, or Firm—Lawrence D. Cutter; James C. Davis, Jr.; Marvin Snyder

[57] ABSTRACT

The gate electrode in an inverted field effect transistor (FET) is fabricated with titanium to provide an FET which is particularly suitable for use as the switching element in a matrix addressed liquid crystal display. More particularly, the resist employed in gate electrode patterning is plasma ashed in an oxygen atmosphere to toughen the titanium gate material and render it more amenable to subsequent processing steps.

18 Claims, 14 Drawing Figures

DEPOSITION AND HARDENING OF TITANIUM GATE ELECTRODE MATERIAL FOR USE IN INVERTED THIN FILM FIELD EFFECT TRANSISTORS

BACKGROUND OF THE INVENTION

The present invention is generally directed to a process for the deposition of gate electrode material in an inverted thin film field effect transistor. More particularly, the present invention is directed to the utilization of specific materials and processes in the fabrication of field effect transistors (FETs) used in matrix addressed liquid crystal displays (LCDs). Even more particularly, the present invention is directed to a simplified process for gate deposition in which problem of undercutting is mitigated and in which titanium gate material is hardened so that it is less affected by subsequent etching and processes which form the silicon islands.

The liquid crystal display device typically comprises a pair of flat panels preferably containing a quantity of liquid crystal material. These liquid crystal materials typically fall into two categories: dichroic dyes and a guest/host system or twisted nematic materials. The flat panels generally possess transparent electrode material disposed on their inner surfaces in predetermined patterns. One panel is often covered completely by a single transparent "ground plane" electrode. The opposite panel is configured with an array of transparent electrodes, referred to herein as "pixel" (picture element) electrodes. Thus, a typical cell in a liquid crystal display includes liquid crystal material disposed between a pixel electrode and a ground electrode forming, in effect, a capacitor-like structure disposed between transparent front and back panels. In general, however, transparency is only required for one of the two panels and the electrodes disposed thereon.

In operation, the orientation of liquid crystal material is affected by voltages applied across the electrodes on either side of the liquid crystal material. Typically, voltage applied to the pixel electrode effects a change in the optical properties of the liquid crystal material. This optical change causes the display of information on the liquid crystal display (LCD) screen. In conventional digital watch displays and in some newer LCD display screens used in miniature television receivers, the visual effect is typically produced by variations in reflected light. However, the utilization of transparent front and back panels and transparent electrodes also permits visual effects to be produced by transmissive effects. These transmissive effects may be facilitated by separately powered light sources for the display, including fluorescent light type devices. LCD display screens may also be employed to produce color images through the incorporation of color filter mosaics in registration with the pixel electrode array. Some of the structures may employ polarizing filters to either enhance or provide the desired visual effect.

Various electrical mechanisms are employed to sequentially turn on and off individual pixel elements in an LCD display. For example, metal oxide varistor devices have been employed for this purpose. However, the utilization of thin film semiconductor switch elements is most relevant herein. In particular, the switch element of the present invention comprises an inverted, thin-film field effect transistor employing a layer of amorphous silicon. These devices are preferred in LCD devices because of their potentially small size, low power consumption, switching speeds, ease of fabrication, and compatibility with conventional LCD structures. The fabrication of these structures is typically accomplished with integrated circuit processing methods employing various stages of deposition masking and material etching. In general, the number of process steps is desired to be low since each added process step increases the probability of defects. In particular, the number of masking steps is desired to be low since, in general, the greater the process complexity, the lower is the reliability of the result, of the device and the process yield. In particular, the present invention is directed to a method for deposition of gate electrode material in such devices in a way in which the process is not only simplified but provides positive advantages for later processing steps.

In the fabrication of inverted thin film FETs, one of the first layers deposited and patterned is the layer defining the gate electrode and gate line patterns. In the past patterning of titanium gate material was accomplished using a wet etching operation. However, the wet etch was hard to control due to a titanium oxide surface layer which was etched much more slowly than the titanium itself. This often resulted in variable and sometimes severe undercutting. For example, in a 10 micron wide gate undercutting by as much as 2 microns occurred. Additionally, the wet etch of the titanium required the deposition of an initial silicon nitride layer to prevent etching of the underlying silicon dioxide or underlying substrate by the hydrogen fluoride-based wet titanium etch. The etching of the silicon dioxide layer during gate formation increases the step height that the gate insulator had to cover. It also adversely affects the surface of the glass so that its optical properties are degraded. The etching of this substrate is minimized by the additional deposition of a silicon nitride layer which etches much more slowly than the silicon dioxide layer. However, even the utilization of the silicon nitride deposition step is undesirable since the deposition can be affected by particulates and has a much slower throughput than the process described herein.

The undercut of the gate structure is particularly undesirable in FETs employed in the LCD devices contemplated herein. Due to the undercut of the gate structure, it can be difficult to align the source and drain mask with the gate structure. This can result in poor source and drain overlap and in many cases no overlap at all which destroys device performance. This results in low fabrication yield. This yield reduction was also further influenced by gate line thinning during etching of the amorphous silicon island areas in the display devices. It was also found that several wafers were lost because of extreme thinning of the titanium gate due to variability and etch time of the silicon islands. Such marginality in a process step is extremely detrimental to overall yield.

SUMMARY OF THE INVENTION

In accordance with a preferred embodiment of the present invention, a method for deposition of gate electrode material in an inverted thin film field effect transistor comprises the following steps. A layer of silicon dioxide is disposed on an insulative substrate following which a layer of titanium is disposed over the silicon dioxide layer. The titanium layer is coated with a positive photoresist which is exposed through a desired pattern mask to create a pattern of exposed resist material. This material is developed in accordance with conventional processes. More particularly, with respect to the present invention, the wafer is then plasma etched, preferably in an atmosphere of carbon tetrafluoride and oxygen to remove titanium from the substrate. The wafer is then plasma ashed in an oxygen atmosphere to remove the remaining resist and also to provide hardening of the titanium gate material so that it is rendered more durable for subsequent process steps.

Accordingly, it is an object of the present invention to provide the process for the fabrication of thin film field effect transistors.

It is a further object of the present invention to provide a structure and process for thin film field effect transistor fabrication in conjunction with the fabrication of liquid crystal display devices.

It is yet another object of the present invention to provide an active matrix LCD display.

It is a still further object of the present invention to provide material, structures and processes to reduce the occurrence of undercutting in the fabrication of gate electrodes for thin film FET devices.

It is a still further object of the present invention to provide a dry etch process for the deposition of titanium gate electrode material.

It is yet another object of the present invention to harden the titanium material to prevent gate line thinning in subsequent processing steps.

Lastly, but not limited hereto, it is an object of the present invention to provide a process for the fabrication of the gate electrode layer in thin film field effect transistor circuits and associated LCD display devices so as to exhibit increased manufacturing yield and more reliable circuit components and displays.

DESCRIPTION OF THE DRAWINGS

The subject matter which is regarded as the invention is particularly pointed out and distinctly claimed in the concluding portion of the specification. The invention itself, however, both as to organization and method of practice, together with further objects and advantages thereof, may best be understood by reference to the following description taken in connection with the accompanying drawings in which;

DETAILED DESCRIPTION OF THE INVENTION

Figure 1:
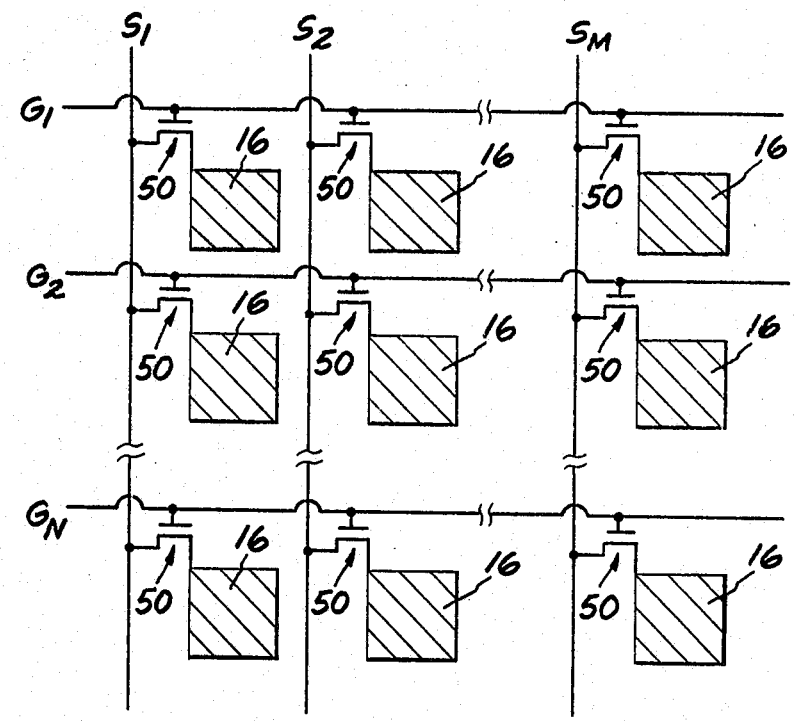
FIG. 1 is a schematic electrical circuit diagram illustrating the context in which the thin film FETs of the present invention are employed.

FIG. 1 illustrates, in schematic diagram form, a matrix addressed liquid crystal display circuit. In particular there is shown an N by M array of pixel electrodes 16 together with associated FET switching elements 50. The gate electrodes of the switching elements in row i are connected to gate drive line $G_i$. Likewise, the source electrode in each column j is connected to data or source line $S_j$. In the figure shown, j ranges from 1 to M and i ranges from 1 to N. It should be realized, however, that many FET structures are symmetric with respect to source and drain properties and that in many situations the source and drain connections can be reversed. However, FIG. 1 particularly shows each pixel electrode 16 being connected to the drain of its associated switching FET. In operation, the pixel element in the $i^{th}$ row and $j^{th}$ column is switched on by simultaneously applying appropriate signals to gate line $G_i$ and data line $S_j$. This applies a voltage to pixel electrodes 16 which acts to alter the optical properties of liquid crystal materials disposed between pixel electrode 16 and the ground plane or counter electrode (not visible in FIG. 1). Pixel electrodes 16 comprise a transparent conductive material such as indium tin oxide.

Figure 2:
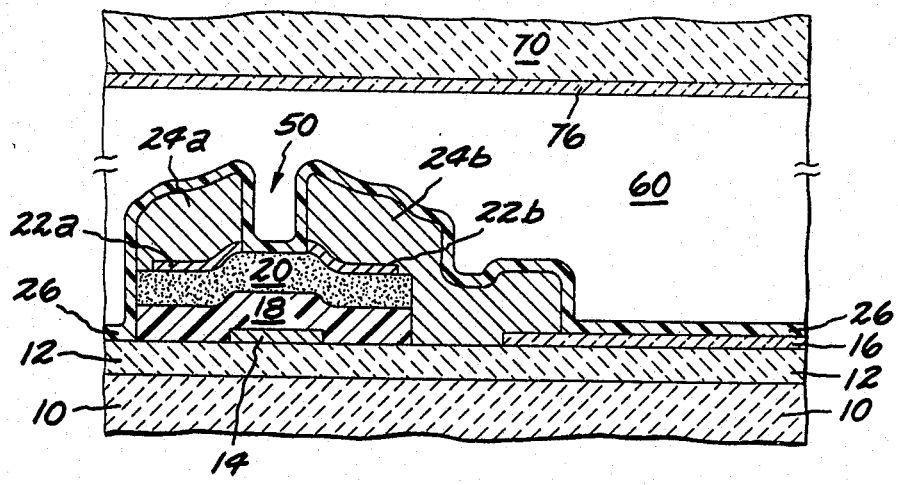
FIG. 2 is a cross sectional side elevation view of a portion of an LCD pixel cell including the FET structure of present invention.

FIG. 2 illustrates a portion of a liquid crystal display device in accordance with the present invention. More particularly, FIG. 2 illustrates both the upper and lower panel for an LCD display. Also illustrated is the physical relationship between the FET structure and a pixel electrode. In FIG. 2 there is shown upper LCD panel 70 which typically comprises a material such as glass. Also disposed on the lower surface of panel 70 is a thin coating of a material such as indium tin oxide 76 which acts as a transparent counter electrode or ground plane electrode. Electrical potential differences appearing between ground plane electrode 76 and pixel electrode 16 produce optical variations in liquid crystal material 60 disposed between these electrodes. It is the optical effects produced by this potential difference which cause information to be displayed on the LCD device. FET 50 and pixel electrode 16 are disposed on an insulative coating 12 on lower LCD display panel 10. Coating 12 typically comprises a material such as silicon dioxide. Panel 10 typically comprises a material such as glass. In general, panel 70, panel electrodes 76, pixel electrode 16, coating 12 and panel 10 may all comprise transparent material. This is particularly useful in LCD displays in which back lighting is employed to form the desired image. However, it is only necessary for either upper panel 70 or lower substrate 10, together with its associated electrode coating, to be transparent.

As indicated above, pixel electrodes 16 are disposed on one of the LCD display panels. It is also necessary to connect each pixel electrode 16 with its associated semiconductor switching element. In the present application, semiconductor switching element 50 comprises an amorphous-silicon-based field effect transistor which includes gate electrode 14 comprising titanium. Over gate electrode 14, there is disposed an insulative layer 18, typically comprising a material such as silicon nitride. Over insulating layer 18, there is disposed an active layer of amorphous silicon 20. In general, it is desirable to dispose source and drain electrodes in direct contact with active silicon material. However, materials such as molybdenum employed in the source and drain metallization layer may not form good electrical contact with intrinsic amorphous silicon particularly if the silicon surface is exposed to subsequent processing steps prior to deposition of the source-drain metal. Accordingly, it is therefore desirable to employ an intermediary contact metal, which can be molybdenum or aluminum, to facilitate and enhance the electrical connection to the amorphous silicon. This includes the utilization of aluminum coatings 22a and 22b for source electrodes 24a and 24b, respectively. At the same time, drain electrode 24b and source electrode 24a are fabricated and disposed so as to provide electrical contact to pixel electrode 16, as shown. Finally, a layer of passivation material 26, such as silicon nitride is disposed over the lower LCD display substrate.

The present invention also encompasses the situation in which N+ amorphous silicon is employed to facilitate contact with the amorphous silicon layer rather than a thin layer of aluminum.

It should also be noted from FIG. 2 that gate electrode 14, together with the associated gate drive lines are in contact with layer 12 as is indium tin oxide layer 16. If these layers are to be deposited at approximately the same step in the fabrication process, the materials chosen for these layers must exhibit some degree of compatibility. This is particularly true with respect to etchants employed in patterning these layers. Accordingly, the structure and process of the present invention employs titanium as a gate electrode material and indium tin oxide as a transparent pixel electrode material. Note, however, that these compatibility problems do not apply to the ground plane electrode disposed on upper substrate 70.

Figure 3A:
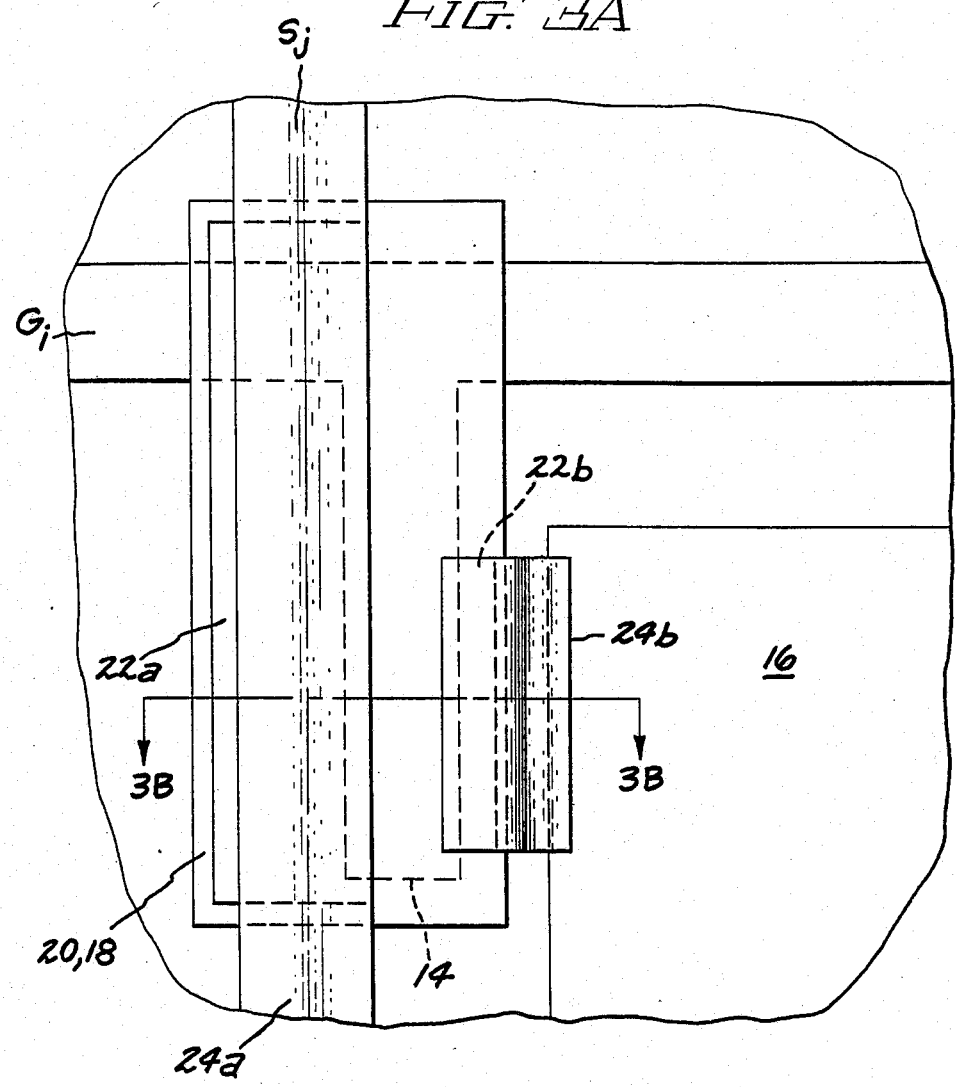
FIG. 3A is a plan view of an FET and a portion of a pixel electrode, in accordance with the present invention.

FIG. 3A is a plan view detailing the physical structure of a switching element 50 and its associated pixel electrode 16 in the vicinity of the intersection of gate drive line $G_i$ and data drive line $S_j$. For completeness, corresponding structures are illustrated in cross-section in FIG. 3B. In particular, FIG. 3A illustrates the presence of an insulative island principally comprising insulative layer 18 and amorphous silicon layer 20. This island provides insulation between data line $S_j$ and gate line $G_i$. It is also seen that data line $S_j$ may also serve directly as the source electrode (or the drain electrode in a reverse situation) for a thin film FET. It is also seen that gate electrode 14 is preferably provided as an extension of gate drive line $G_i$. The gate drive lines and the gate electrodes are most preferably fabricated in the same process step and comprise the same material and in this particular invention, titanium is employed to ensure compatibility with indium tin oxide pixel electrode 16.

Figure 3B:
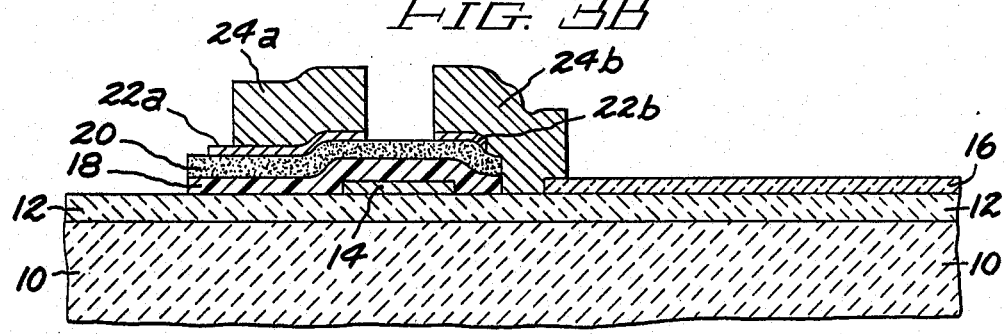
FIG. 3B is a cross sectional side elevation view which more particularly illustrates alignment of the FET structure with portions shown in the plan view of FIG. 3A.

Since the gate electrode is fabricated in an early process step and is disposed on the underlying insulative substrate and since the gate insulation layer also insulates the gate and source electrodes, the FET structures shown in FIGS. 2 and 3B are described as being inverted FETs. This term, however, applies only to their physical rather than electrical properties.

Although it may appear that the structure shown in FIGS. 1, 2 and 3 is readily constructable, it must also be appreciated that there are significant material and material etchant compatibility problems involved in fabricating the structure shown. The process of the present invention employs materials and steps which overcome these compatibility problems and at the same time results in a fabrication process employing a minimal number of masking operations. The use of a large number of masking operations is, in general, to be avoided because of the problems of device reliability and yield. Accordingly, FIGS. 4A through 4J illustrate various steps in the fabrication of the device shown in FIGS. 1 through 3. In particular, the fabrication process illustrated in these figures is directed to the production of thin film amorphous silicon based FET switching element devices which are compatible with the utilization of indium tin oxide as a transparent electrode material.

Figure 4A:
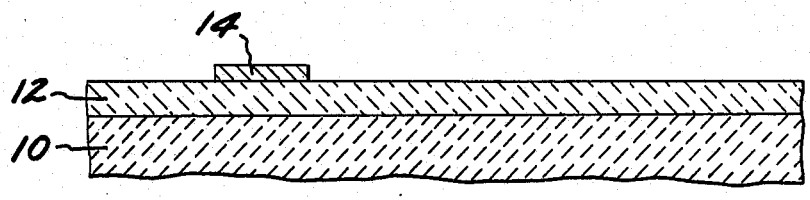
FIG. 4A is a cross section side elevation view which particularly shows the result of the process of the present invention.

In accordance with a preferred embodiment of the present invention, the gate electro-de pattern illustrated in FIG. 4A and also in FIG. 3A is formed or fabricated by means of a dry plasma etching. In this process, an insulative substrate, preferably glass, is coated with a layer of silicon dioxide to a thickness of approximately 1,200 Angstroms. Prior to coating the silicon on the substrate, the substrate is cleaned in order to bring the wafer or chip up to processing quality. Silicon dioxide layer 12 is then preferably disposed thereon by sputtering or plasma enhanced chemical vapor deposition. However, recent studies indicate that layer 12 is optional. The wafer is then preferably cleaned and coated with a layer of titanium to a thickness of approximately 800 Angstroms. This deposition is preferably performed by electron beam evaporation. The resulting substrate is then preferably water cleaned and coated with a positive photoresist The photoresist is then exposed through the desired pattern mask to create a pattern of exposed resist material. Suitable resist material includes Shippley 1450J. This resist is then developed. It is pointed out that in prior processes employed for gate material deposition, a silicon nitride deposition process step was required to prevent the wet etchants employed in gate removal from attacking the underlying silicon oxide layer. This process step is avoided in the present invention along with the cleaning step that it necessitated. With particular reference to the present invention, the resultant substrate is now plasma etched to remove titanium present beneath the exposed resist pattern. This plasma etch preferably occurs in an atmosphere of carbon tetrafluoride with 4% oxygen. The use of this process for etching the titanium gate material allows the elimination of the silicon nitride protection layer mentioned above since silicon dioxide is a more effective etchant stop than silicon nitride for the carbon tetrafluoride plasma. The plasma etched gates routinely reduce the undercutting from 2.0 microns (as frequently encountered with wet etching) to approximately 0.5 microns thereby resulting in higher device yield due to improved source/drain overlap control. Furthermore, the resulting substrate in the process of the present invention is then plasma ashed in an oxygen atmosphere to remove the remaining photoresist material. Ashing is preferably performed at temperatures of from 80° C. to 150° C. in an ambient atmosphere of pure oxygen at a pressure of from about 0.1 to about 10 torr and with an RF power level of from about 50 to 300 watts. This process has the side benefit that the titanium gate material is exposed to an oxygen atmosphere which tends to harden the gate material and makes it less susceptible to erosion in the subsequent process steps, particularly the formation of the nitride and silicon islands, as described below. Finally, in the process of the present invention, a remaining resist material is stripped from the substrate.

Figure 4B:
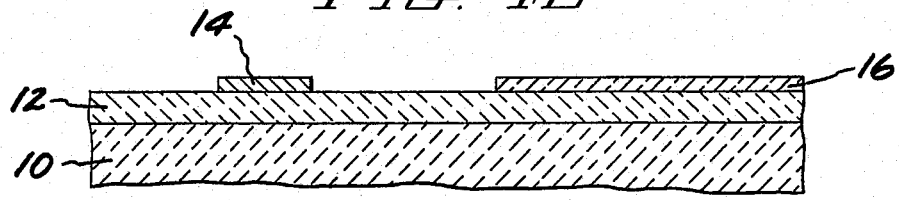
FIGS. 4B–4J are cross sectional side elevation views illustrating further steps in the fabrication of FET and LCD structures.

FIG. 4B illustrates the next step in the process. In this step, indium tin oxide pixel electrode material 16 is sputter deposited and wet etched. The process step illustrated in FIG. 4B, therefore, represents the second masking step employed in the present invention. The formation of the pixel electrodes is performed after the formation of the gate metallization pattern to avoid exposure to the short wet etch of the gate metallization. The material of pixel electrode 16 is preferably deposited by sputter deposition of indium tin oxide to a thickness of approximately 900 Angstroms.

Figure 4C:
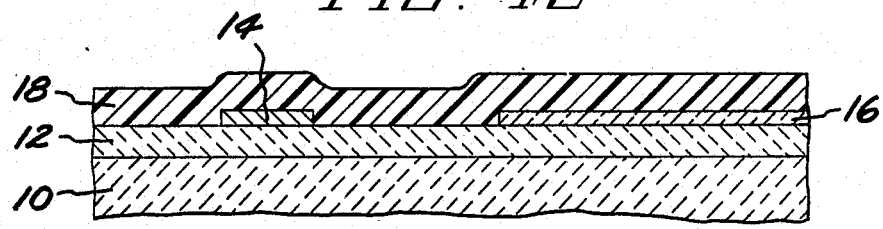
Figure 4D:
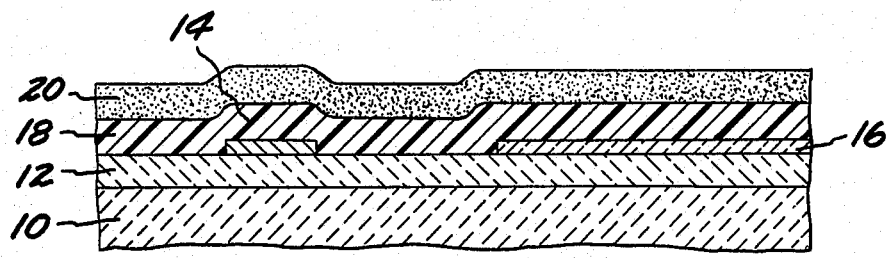
Figure 4E:
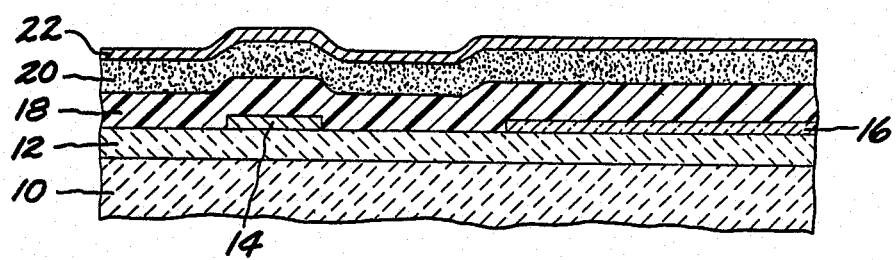

FIG. 4C illustrates the next step in the process of the present invention which comprises deposition of insulative layer 18. This layer preferably comprises silicon nitride which is preferably-formed by plasma enhanced chemical vapor deposition (PECVD) to a thickness of approximately 1,500 Angstroms. Next, an amorphous silicon layer is likewise deposited to a thickness of approximately 2,000 Angstroms. It should be noted the formation of the silicon nitride and amorphous silicon layers is preferably performed in a single operation, that is, they are deposited sequentially merely by changing the gases employed in the vacuum vessel without breaking its seal. For a general description of the PECVD process see "Plasma-promoted Deposition of Thin Inorganic Films" by M. Rand In J. Vac. Sci. Tech., Vol. 16, page 420 (1979). Although it is significantly less desirable, it is also possible to form the amorphous silicon layer by sputtering and subsequent hydrogenation. An important aspect of the process is that the next layer of aluminum be deposited relatively immediately following the amorphous silicon deposition in order to achieve reliable contact. This is very desirable because of oxidation and contamination of the silicon surface which could occur otherwise. With respect to the immediacy of the deposition of aluminum, it is pointed out that this deposition occur prior to any other surface treatment. For example, it is undesirable to delay deposition of aluminum for longer than approximately 2 hours if the substrate surface is exposed to air. Maintenance of the substrate in inert atmospheres would, of course, prolong this period of time. Nonetheless, since it is desirable to ensure good contact with the amorphous silicon material, it is generally better to deposit the aluminum layer as soon as practical without subsequent surface treatment. The deposition of amorphous silicon layer 20 is illustrated in FIG. 4D and the electron beam evaporation of aluminum layer 22 is illustrated in FIG. 4E. The aluminum is typically deposited to a thickness of approximately 500 Angstroms. The amorphous silicon layer is preferably deposited by plasma deposition to a thickness of approximately 2,000 Angstroms. The resulting structure is shown in FIG. 4E.

While the gate formation process of the present invention has been particularly described in conjunction with the use of an aluminum layer to facilitate electrical contact to the intrinsic amorphous silicon layer, the process of the present invention is also employable when an N+ amorphous silicon layer is employed in its place to serve the same function. The N+ amorphous silicon layer is formed in essentially the same process step as the silicon nitride and intrinsic amorphous silicon layers merely by substituting appropriate gases in the process chamber without breaking the airtight seal.

Figure 4F:
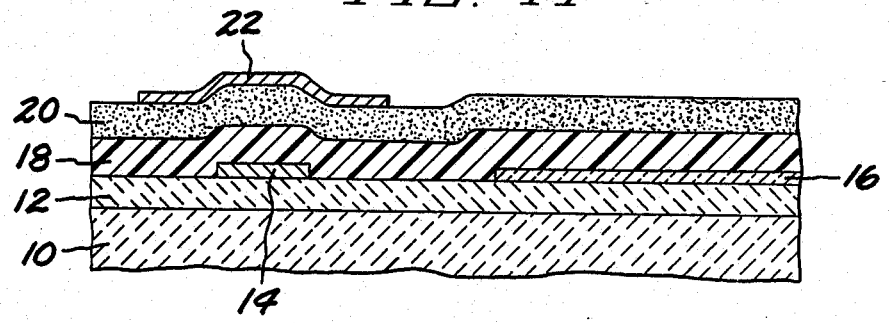

FIG. 4F illustrates that the next step in the process is the patterning of aluminum layer 22 so that the aluminum layer is cut back from the desired island structure (more completely formed in subsequent processing), which is particularly indicated by reference in numerals 20 and 18 in FIG. 3A. The presence of aluminum layer 22 satisfies the contact requirements, and since it is etched with the indium tin oxide covered by gate nitride, no "Swiss cheese" appearance of pixel electrode layer 16 is observed.

Figure 4G:
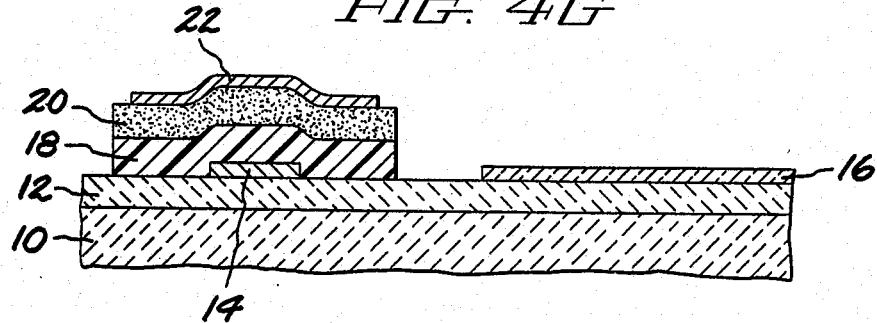

FIG. 4G illustrates the next step in the process in which the amorphous silicon and silicon nitride islands are patterned. This operation represents the fourth masking step. The mask employed may be the same mask as that employed to form the aluminum islands. In order to use the same mask, a double exposure is made in which the mask is shifted back and forth in the same diagonal direction twice to insure greater aluminum removal. However, in general, it is preferable to employ a separate mask for patterning the silicon and nitride portions of the island structure. The purpose of this cut back or set back for the aluminum layer is to prevent undercutting which could occur as a result of differential material etch rates for aluminum and other island constituents. The plasma etchant employed to remove the silicon nitride and amorphous silicon layers does not attack the indium tin oxide layer.

Figure 4H:
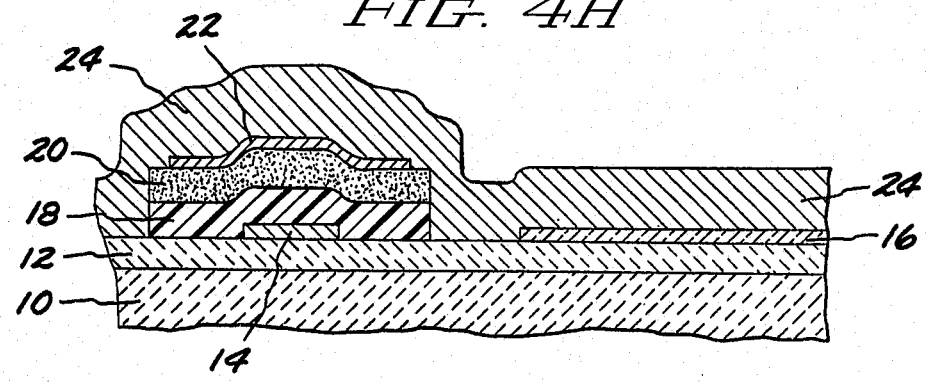
Figure 4I:
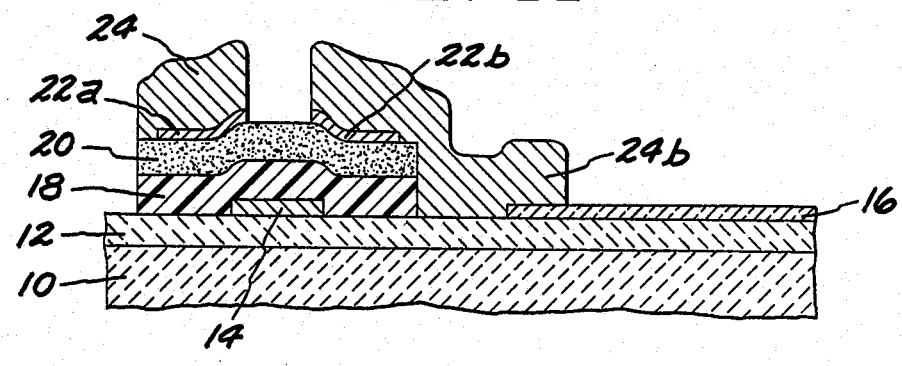
Figure 4J:
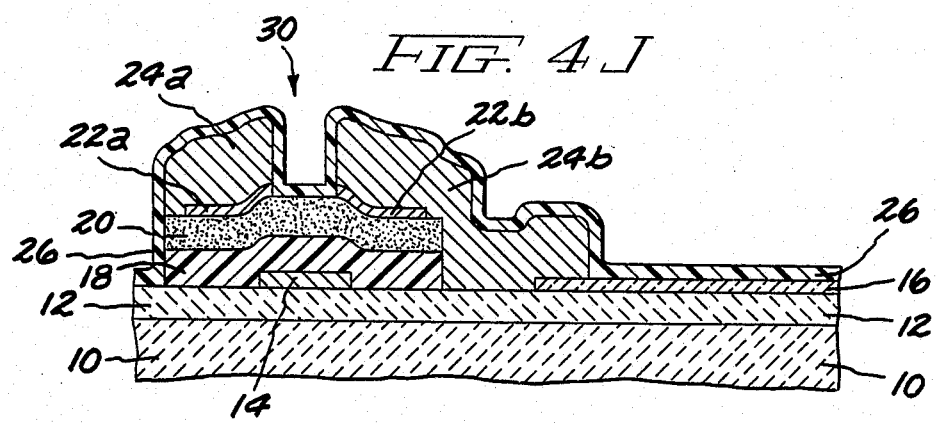

FIG. 4H illustrates the next step in the process of the present invention in which a layer of molybdenum is deposited on the substrate. For example, a 3,000 Angstrom thick layer of molybdenum 24 may be so deposited. As shown in FIG. 4I, this layer is then patterned using a wet etch with a mixture of phosphoric acid, acetic acid and weak nitric acids (PAWN) with no attack of the indium tin oxide material. The PAWN etch also removes the small amount of aluminum from the channel between the source and drain pads. The molybdenum source-drain deposition forms a silicide around the edge of the island which results in gate and source drain leakage. However, this is eliminated by plasma etching of the exposed silicon surface (back channel etching) and the device is then deposited with a low temperature nitride for protection and passivation of the exposed silicon surface. See FIG. 4J.

From the above, it should be appreciated that the gate electrode deposition process of the present invention provides a simplified process for the manufacture of inverted thin film field effect transistors. It is further seen that this process results in the formation of hardened gate material which tends to be much more immune to attack from etchants employed in subsequent processing steps. It is further seen that the method of the present invention eliminates the need for disposing a protective silicon nitride layer. It is also seen that the method for gate electrode deposition described herein-significantly eliminates the problem of undercutting which is experienced in more conventional wet etching processes. However, it is seen that the process described herein is, in general, compatible with conventional VLSI processing method. It should also be appreciated that the present invention is one in which the processing method enabled reliable and high yield fabrication of responsive high resolution liquid crystal display devices.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

The invention claimed is:

1. A method for deposition of gate electrode material in an inverted thin film field effect transistor, said method comprising the steps of:
    disposing a layer of silicon oxide on an insulative substrate;
    disposing a layer of titanium over said silicon oxide layer;
    coating said titanium layer with a positive photoresist;

exposing said photoresist through a desired pattern mask to create a pattern of exposed resist material;

developing said resist layer;

plasma etching said titanium beneath said exposed resist;

plasma ashing at least some of the remaining resist in an oxygen atmosphere; and stripping any remaining resist.

2. The method of claim 1 in which the silicon oxide is disposed by sputter deposition.

3. The method of claim 1 in which said silicon oxide is disposed to a thickness of approximately 1,200 Angstroms.

4. The method of claim 1 in which said insulative substrate comprises glass.

5. The method of claim 1 in which said silicon oxide disposition includes cleaning said substrate prior to deposition of said oxide.

6. The method of claim 1 in which said titanium is deposed by electron beam evaporation.

7. The method of claim 1 in which said titanium is disposed to a thickness of approximately 800 Angstroms.

8. The method of claim 1 further including cleaning said substrate after deposition of said silicon oxide.

9. The method of claim 1 further including the step of cleaning said substrate after deposition of said titanium layer.

10. The method of claim 1 in which the plasma etching of said titanium occurs in an atmosphere of carbon tetrafluoride and oxygen.

11. The method of claim 10 in which said oxygen comprises 4% by volume of said atmosphere.

12. The method of claim 1 in which said plasma ashing occurs at temperatures from about 80° C. to about 150° C.

13. The method of claim 1 in which said plasma ashing occurs at pressures from about 0.1 to about 10 torr.

14. The method of claim 1 in which said plasma ashing occurs at radio frequency power levels from about 50 to about 300 watts.

15. A method for deposition of gate electrode material in an inverted thin film field effect transistor, said method comprising the steps of:

disposing a layer of titanium on an insulative substrate layer;

coating said titanium mayer with a positive photoresist;

exposing said photoresist through a desired pattern mask to create a pattern of exposed resistor material;

developing said resist layer;

plasma etching said titanium beneath said exposed resist;

plasma ashing at least some of the remaining resist in an oxygen atmosphere; and stripping any remaining resist.

16. The method of claim 15 in which said plasma ashing occurs at temperatures from about 80° C. to about 150° C.

17. The method of claim 15 in which said plasma ashing occurs at pressures from about 0.1 to about 10 torr.

18. The method of claim 15 in which said plasma ashing occurs at radio frequency power levels from about 50 to about 300 watts.

* * * * *